United States Patent
Pai et al.

(10) Patent No.: US 8,237,239 B2
(45) Date of Patent: Aug. 7, 2012

(54) SCHOTTKY DIODE DEVICE AND METHOD FOR FABRICATING THE SAME

(75) Inventors: Huang-Lang Pai, Hsinchu (TW); Hung-Shern Tsai, Tainan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 391 days.

(21) Appl. No.: 12/607,724

(22) Filed: Oct. 28, 2009

(65) Prior Publication Data

US 2011/0095391 A1 Apr. 28, 2011

(51) Int. Cl.
*H01L 29/872* (2006.01)

(52) U.S. Cl. ......... 257/484; 257/471; 257/E21.135; 257/E21.359; 257/E21.338; 438/174; 438/542; 438/570

(58) Field of Classification Search ............ 257/471, 257/484
See application file for complete search history.

(56) References Cited

U.S. PATENT DOCUMENTS

| | | | |
|---|---|---|---|
| 5,614,755 A * | 3/1997 | Hutter et al. | 257/471 |
| 6,175,143 B1 * | 1/2001 | Fujihira et al. | 257/471 |
| 6,597,050 B1 * | 7/2003 | Dunn et al. | 257/453 |
| 7,064,407 B1 * | 6/2006 | Mallikarjunaswamy | 257/471 |
| 2004/0012066 A1 * | 1/2004 | Dietl et al. | 257/471 |
| 2005/0006662 A1 * | 1/2005 | Morand et al. | 257/107 |
| 2006/0157748 A1 * | 7/2006 | Chong et al. | 257/288 |
| 2007/0278608 A1 * | 12/2007 | Shim et al. | 257/481 |
| 2008/0135970 A1 * | 6/2008 | Kim et al. | 257/471 |
| 2009/0294865 A1 * | 12/2009 | Tang et al. | 257/369 |
| 2010/0148253 A1 * | 6/2010 | Tu et al. | 257/337 |
| 2011/0156199 A1 * | 6/2011 | Yoo et al. | 257/485 |

* cited by examiner

*Primary Examiner* — Matthew W Such
*Assistant Examiner* — Abul Kalam

(57) ABSTRACT

A Schottky diode device is provided, including a p-type semiconductor structure. An n drift region is disposed over the p-type semiconductor structure, wherein the n drift region comprises first and second n-type doping regions having different n-type doping concentrations, and the second n-type doping region is formed with a dopant concentration greater than that in the first n-type doping region. A plurality of isolation structures is disposed in the second n-type doping region of the n drift region, defining an anode region and a cathode region. A third n-type doping region is disposed in the second n-type doping region exposed by the cathode region. An anode electrode is disposed over the first n-type doping region in the anode region. A cathode electrode is disposed over the third n-type doping region in the cathode region.

18 Claims, 3 Drawing Sheets

SCHOTTKY DIODE DEVICE AND METHOD FOR FABRICATING THE SAME

BACKGROUND OF THE INVENTION

1. Field of the Invention

The present invention relates to semiconductor devices, and in particular, to a Schottky diode device and a method for fabricating the same.

2. Description of the Related Art

A Schottky diode is a semiconductor device having a metal-semiconductor junction, and a current-voltage character at the metal-semiconductor junction is dependant upon a direction of a voltage applied thereon.

When the Schottky diode is forward biased (i.e. a positive voltage is applied on the anode and a negative voltage is applied on the cathode), carriers can be conducted, and carriers cannot be conducted when the Schottky diode is reverse biased (i.e. a positive voltage is applied on the cathode and a negative voltage is applied on the anode). Thus, the Schottky diode shows a single direction conductive character similar with a conventional diode with a p-n junction. In addition, since the Schottky diode allows single carrier movement, a relatively low threshold voltage and a fast switching speed during switching of forward and reverse biases can be achieved.

Referring to FIG. 1, a cross section of a conventional Schottky diode 100 is illustrated. As shown in FIG. 1, the Schottky diode device 100 includes main components such as an n drift region 104, an anode electrode 112, a cathode electrode 114 and an n+ doping region 116 formed in the n drift region 104. The n drift region 104 is formed in a top surface of a p-type silicon substrate 102, and two spaced field oxides 108 are formed over a top surface of the n drift region 104 to define an anode region 150 and a cathode region 160 in the top surface of the n drift region 104 which are spaced by the field oxides 108. A patterned interlayer dielectric layer 110 is formed over the n drift region 104, covering the field oxides 108 and portions of the top surface of the n drift region 104 and the n+ region 116 adjacent to the field oxides 108. An anode electrode 112 and a cathode electrode 114 made of materials such as titanium, titanium nitride, tungsten, or aluminum respectively covers and penetrates the interlayer dielectric layer 110 to contact the n drift region 104 in the anode region 150 and the n+ doping region 116 in the cathode region 160. A p-type doping region 106 is respectively formed in the n drift region 104 and is adjacent to each of the field oxides 108 in the anode region 150 for preventing a high electric field from happening at the electrode 112, at a region adjacent to the n drift region 104 and the field oxide 108, thereby improving a breakdown voltage of the Schottky diode device 100. A metal-semiconductor junction 120 is formed at an interface of the anode electrode 112 and the n drift region 104 in the Schottky diode device 100.

In addition, for further improving breakdown voltage of the Schottky diode device 100 under a reverse bias, an n-type dopant concentration in the n drift region 104 is normally of not greater than $2.0*10^{16}$ atoms/cm$^3$. Such a dopant concentration is helpful for improving the breakdown voltage under a reverse bias but still restricts current spreading per unit area between the anode region 150 and the cathode region 160 when the Schottky diode device 100 is forward biased.

Therefore, a novel Schottky diode device is needed to satisfy high breakdown voltage under a reverse bias and allow high current spreading per unit area when the Schottky diode device is forward biased.

BRIEF SUMMARY OF THE INVENTION

Schottky diode devices and methods for fabricating the same are provided.

An exemplary Schottky diode device comprises a p-type semiconductor structure. An n drift region is disposed over the p-type semiconductor structure, wherein the n drift region comprises first and second n-type doping regions having different n-type doping concentrations, and the second n-type doping region surrounds sidewalls of the first n-type doping region and is formed with a dopant concentration greater than that in the first n-type doping region. A plurality of isolation structures is disposed in the second n-type doping region of the n drift region, defining an anode region and a cathode region, wherein the anode region exposes a top surface of the first n-type doping region and the cathode region partially exposes a top surface of the second n-type doping region. A third n-type doping region is disposed in the second n-type doping region exposed by the cathode region, wherein the third n-type doping region is formed with a dopant concentration greater than that in the second n-type doping region. An anode electrode is disposed over the first n-type doping region in the anode region. A cathode electrode is disposed over the third n-type doping region in the cathode region.

An exemplary method for fabricating a Schottky diode device comprises providing a p-type semiconductor layer. An n drift region is formed in the p-type semiconductor layer, wherein the n drift region comprises a first n-type doping region and a second n-type doping region surrounding the first n-type doping region, and the second n-type doping region is formed with a dopant concentration greater than that in the first n-type doping region. A plurality of isolation structures is formed in the second n-type doping region adjacent to the first n-type doping region, thereby defining an anode region and a cathode region over the p-type semiconductor layer, wherein the anode region exposes the first n-type doping region and a portion of the second n-type doping region adjacent to the first n-type doping region, and the cathode region exposes another portion of second n-type doping region. A third n-type doping region is formed in the second n-type doping region exposed by the cathode region. An anode electrode and a cathode electrode are formed in the anode region and the cathode region, respectively contacting the first n-type doping region and the third n-type doping region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-6 are schematic cross sections showing an exemplary method for fabricating a Schottky diode device.

Figure 2:
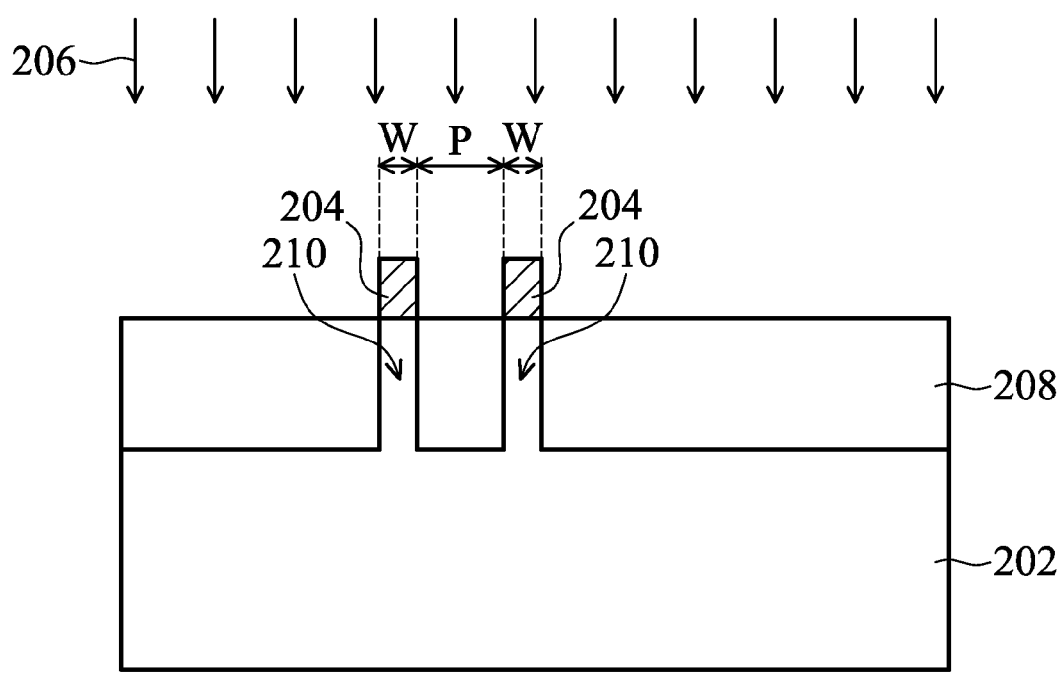
FIGS. 2-6 are cross sections showing a method for fabricating a Schottky diode device according to an embodiment of the invention.

In FIG. 2, a p-type semiconductor structure such as a p-type semiconductor layer 202 is first provided. The p-type semiconductor layer 202 may be a part of an epitaxial layer or a substrate comprising semiconductor materials such as silicon, silicon germane, or the like. A plurality of patterned mask layers 204 is then formed over a top surface of the p-type semiconductor layer 202, exposing portions of the p-type semiconductor layer 202. Next, an ion implantation process 206 is performed on the p-type semiconductor layer 202 by using the mask layers 204 as an implant mask, thereby forming a plurality of spaced n-type doping regions 208 in the p-type semiconductor layer 202. In the ion implantation process 206, n-type dopants such as phosphor and arsine can be implanted under an energy level of about 500-800 KeV and a dosage of about $2*10^{12} \sim 8*10^{12}$ atoms/cm$^2$.

As shown in FIG. 2, since a plurality of mask layers 204 is provided over the p-type semiconductor layer 202, a plurality of p-type strip regions 210 which is not doped in the ion implantation process 206 are formed between the n-type doping regions 208, which have the same doping concentration and doping characteristic with that of the p-type semiconductor layer 202. Herein, the mask layers 204 are formed with a width W of about 0.4-0.8 μm and a pitch P of about 0.4-0.8 μm therebetween. Thus, the width W and the pitch P of the adjacent mask layers 204 can be adjusted by controlling amounts of the mask layers 204 formed over the p-type semiconductor layer 202 to thereby control amounts, ranges, and configurations of the p-type strip regions 210.

Figure 3:
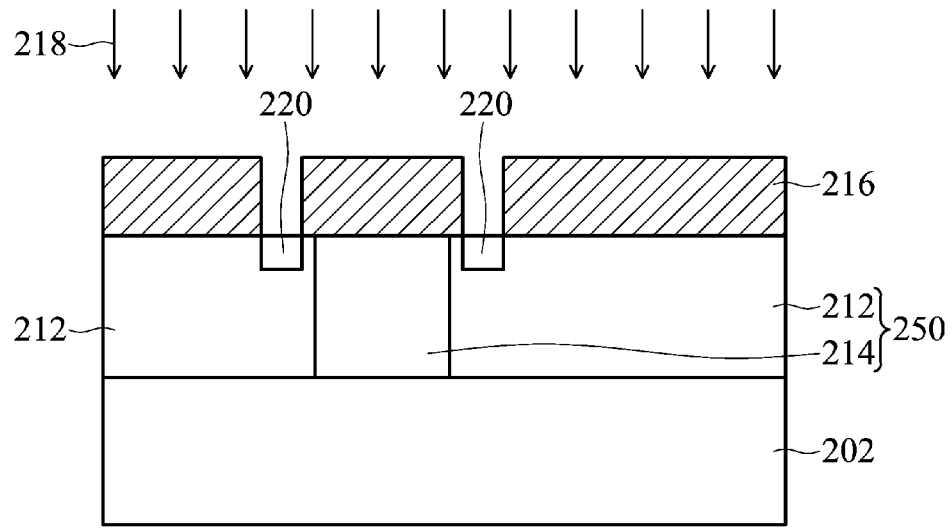

In FIG. 3, after removal of the mask layers 204 (see FIG. 2) formed over the p-type semiconductor layer 202, an annealing process (not shown) is performed under a temperature of about 1000-1100° C. Thus, a first n-type doping region 214 and a second n-type doping region 212 surrounding sidewalls of the first n-type doping region 214 are formed in the p-type semiconductor layer 202 after the annealing process. Bottom surfaces of the first n-type doping region 214 and the second n-type doping region 212 contact the p-type semiconductor layer 202. Herein, the second n-type doping region 212 is formed with a dopant concentration of about $2*10^{16} \sim 10^{16}$ atoms/cm$^3$, and the first n-type doping region 214 is formed with a dopant concentration of about $4*10^{15} \sim 2*10^{16}$ atoms/cm$^3$. The second n-type doping region 212 is formed with a dopant concentration greater than that of the first n-type doping region 214, and the p-type strip regions 210 (see FIG. 2) no more exist after the annealing process. The first n-type doping region 214 and the second n-type doping region 212 form an n drift region 250 for a Schottky diode device.

In FIG. 3, a patterned mask layer 216 is formed over the top surface of the n drift region 250 and portions of the second n-type doping region 212 on both sides of the first n-type doping region 214 are exposed. Next, an ion implantation process 218 is performed, using the mask layer 216 as an implant mask, to thereby form a p-type doping region 220 in the second n-type doping region 212 on both sides of the first n-type doping region 214. In the ion implantation process 218, p-type dopants such as boron are implanted at an energy level of about 40-80 KeV and a dosage of about $8*10^{13} - 5*10^{14}$ atoms/cm$^2$.

Figure 4:
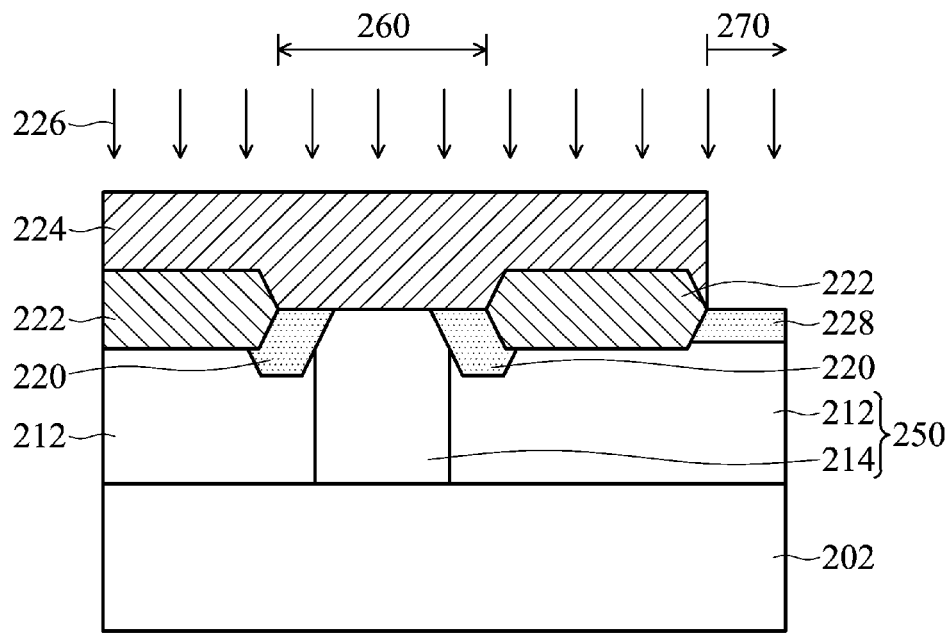

In FIG. 4, after removal of the mask layer 216 (see FIG. 3), two spaced isolation structures 222 are formed over the second n-type doping region 212 in the n drift region 250, thereby defining an anode region 260 and a cathode region 270 of a Schottky diode device over the top surface of the n drift region 250. Herein, the isolation structures 222 are illustrated as conventional field oxides and are formed by conventional field oxide fabrication methods. The isolation structures 222 are not limited by the filed oxides illustrated in FIG. 4 and can be other isolation structures. During formation of the isolation structures 222, an annealing process can be simultaneously performed on the p-type doping regions 220 and the p-type doping regions 220 are further diffused to a place adjacent to a corner of each of the isolation structures 222 and covers the corner of each of the isolation structures 222. The p-type doping regions 220 also partially diffuse into the first n-type doping region 214. Next, a patterned mask layer 224 is formed to substantially cover the isolation structures 222 and the anode region 260 and a top surface of the second n-type doping region 212 in the cathode region 270 is exposed. Next, an ion implantation process 226 is then performed to form an n+ doping region 228 on the top surface of the second n-type doping region 212 as a cathode node. In the ion implantation process 226, n-type dopants such as phosphor and arsenic are implanted with an energy level of about 40-60 KeV and a dosage of about $1*10^{15} \sim 5*10^{15}$ atoms/cm$^2$.

Figure 5:
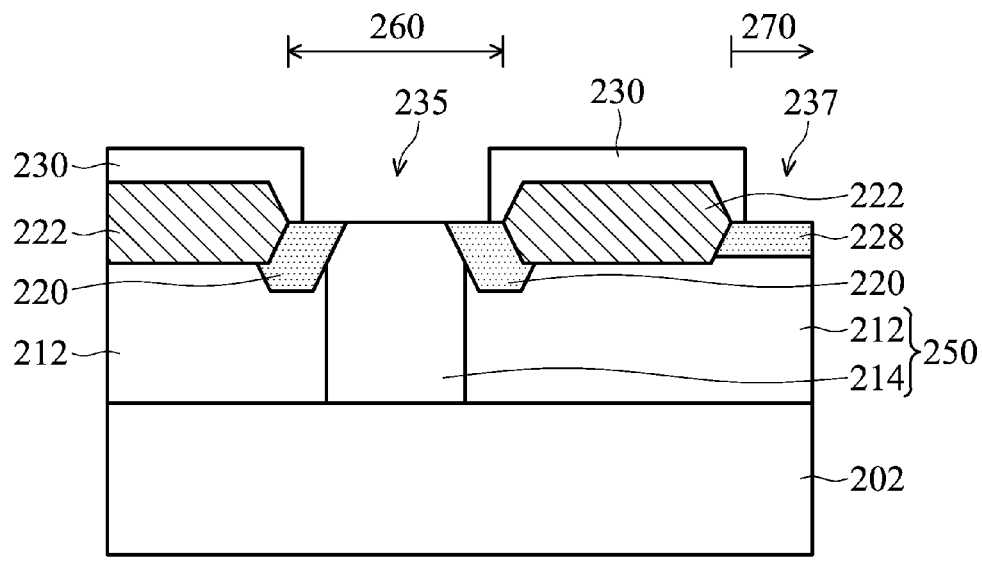

In FIG. 5, after removal of the mask layer 224, a patterned interlayer dielectric layer 230 is formed to substantially cover the isolation structures 222 and portions of the p-type doping region 220 and n+ doping region 228 adjacent the isolation structures 222. Openings 235 and 237 are formed in the interlayer dielectric layer 230 to respectively expose an entire top surface of the first n-type doping region 214 and portions of the top surface of the n+ doping region 228.

Figure 6:
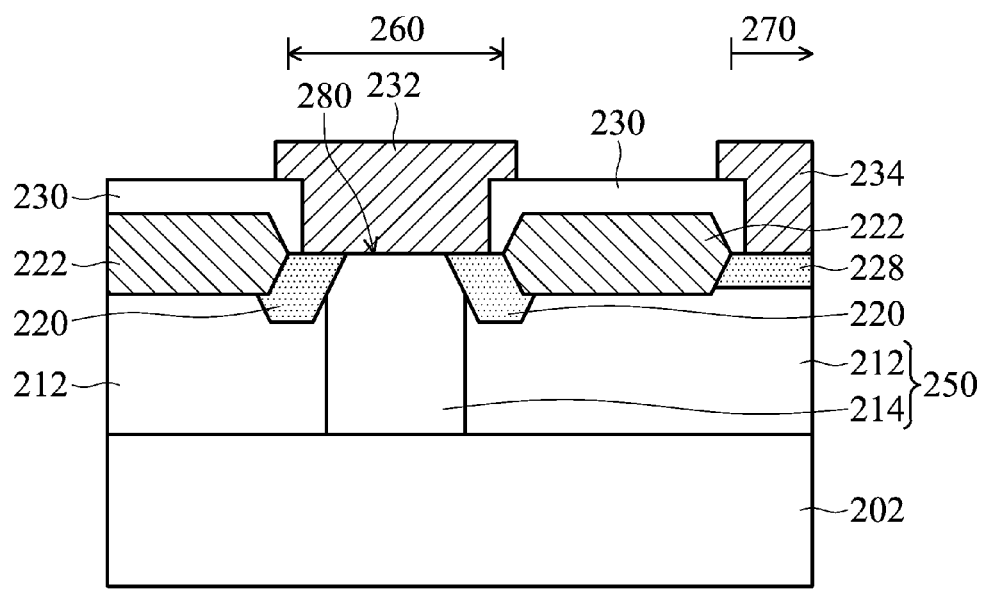

In FIG. 6, patterned electrode layers 232 and 234 are formed. The electrode layer 232 is disposed over the p-type doping region 220 and the first n-type doping region 214, partially covering the interlayer dielectric layer 230 adjacent thereto. The electrode layer 234 is disposed over the n+ doping region 228, partially covering the interlayer dielectric layer 230 adjacent thereto. The electrode layers 232 and 234 function as an anode electrode and a cathode electrode, respectively, and may comprises materials such as titanium, titanium nitride, tungsten, or aluminum and can be formed by conventional processes such as film deposition, mechanical polishing and etching processes.

As shown in FIG. 6, an exemplary Schottky diode device is provided, comprising a p-type semiconductor structure (e.g. the p-type semiconductor layer 202), and an n drift region disposed over the p-type semiconductor structure, wherein the n drift region comprises first and second n-type doping regions (e.g. the first and second n-type doping regions 214 and 212) having different n-type doping concentrations, and the second n-type doping region surrounds sidewalls of the first n-type doping region and is formed with a dopant concentration greater than that in the first n-type doping region. A plurality of isolation structures (e.g. the isolation structures 222) is disposed in the second n-type doping region of the n drift region, defining an anode region (e.g. the anode region 260) and a cathode region (e.g. the cathode region 270), wherein the anode region exposes a top surface of the first n-type doping region and the cathode region partially exposes a top surface of the second n-type doping region. A third n-type doping region (e.g. the n+ doping region 228) is disposed in the second n-type doping region exposed by the cathode region, wherein the third n-type doping region is formed with a dopant concentration greater than that in the second n-type doping region. An anode electrode (e.g. the anode electrode 232) is disposed over the first n-type doping region in the anode region, and a cathode electrode (e.g. the cathode electrode 234) is disposed over the third n-type doping region in the cathode region.

In this embodiment, the Schottky diode device has an n drift region 250 including a first n-type doping region 214 of a relatively low dopant concentration and a second n-type doping region 212 of a relatively higher dopant concentration. The first n-type doping region 214 physically contacts the anode electrode 232 and a breakdown voltage at the metal-semiconductor interface 280 between the anode electrode 232 and the first n-type doping region 214 under reverse bias is improved due to the relative low n-type dopant concentration in the first n-type doping region 214. In addition, since the second n-type doping region 212 between the anode region 260 and the cathode region 270 is formed with a relatively high n-type dopant concentration, current spreading per unit area of the Schottky diode device is thus improved.

Figure 1:
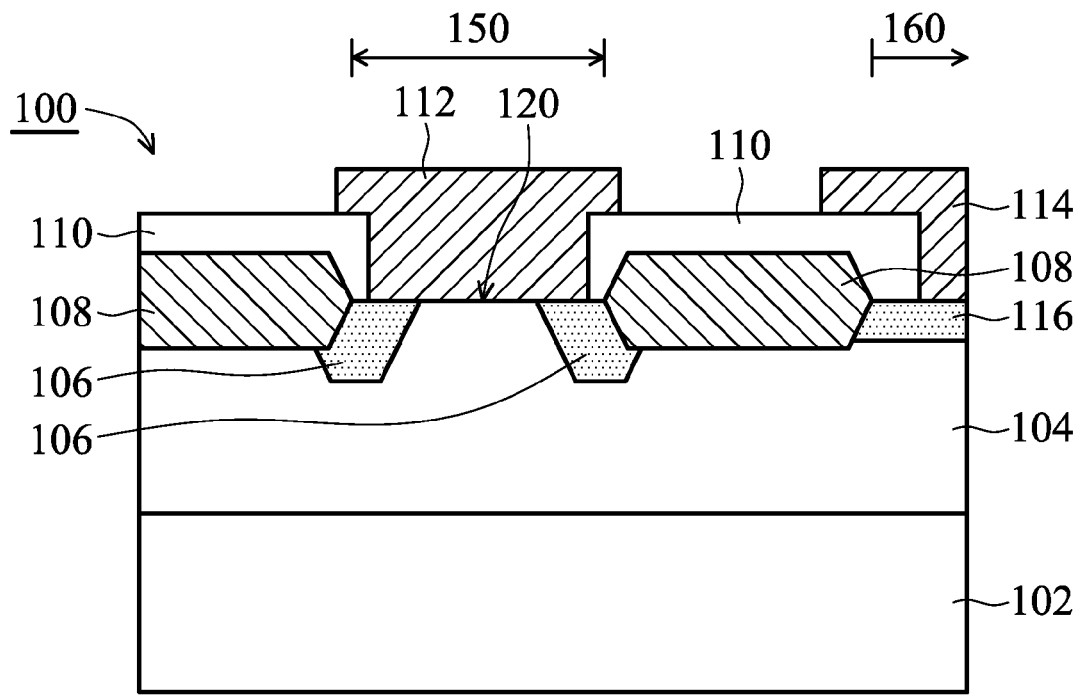
FIG. 1 is cross section of a conventional Schottky diode device.

Moreover, according to the process steps illustrated in FIGS. 2-6, fabrication of the Schottky diode device of the invention can be achieved by only modifying a mask for forming the n drift region 104 when fabricating the conventional Schottky diode device as illustrated in FIG. 1. The n drift region 250 including two different kinds of n-type dopant concentrations shown in FIG. 6 are formed without using additional masks and the n-type dopant concentration under the Schottky junction 280 can be controlled by adjusting amounts, widths, and the pitches of the p-type strip regions 210.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A Schottky diode device, comprising:
    a p-type semiconductor structure;
    a n drift region disposed over the p-type semiconductor structure, wherein the n drift region comprises first and second n-type doping regions having different n-type doping concentrations, and the second n-type doping region surrounds sidewalls of the first n-type doping region and is formed with a dopant concentration greater than that in the first n-type doping region, and a bottom surface of the first n-type doping region physically contacts the p-type semiconductor structure;
    a plurality of isolation structures disposed in the second n-type doping region of the n drift region, defining an anode region and a cathode region, wherein the anode region exposes a top surface of the first n-type doping region and the cathode region partially exposes a top surface of the second n-type doping region;
    a third n-type doping region disposed in the second n-type doping region exposed by the cathode region, wherein the third n-type doping region is formed with a dopant concentration greater than that in the second n-type doping region;
    an anode electrode disposed over the first n-type doping region in the anode region; and
    a cathode electrode disposed over the third n-type doping region in the cathode region.

2. The Schottky diode device as claimed in claim 1, wherein the first n-type doping region is formed with a dopant concentration of about $4*10^{15}$~$2*10^{16}$ atoms/cm$^3$, and the second n-type doping region is formed with a dopant concentration of about $2*10^{16}$~$8*10^{16}$ atoms/cm$^3$.

3. The Schottky diode device as claimed in claim 1, wherein a bottom surfaces of the second n-type doping regions physically contacts the p-type semiconductor structure.

4. The Schottky diode device as claimed in claim 1, further comprising a p-type doping region disposed in the first and second n-type doping regions exposed by the anode region, covering a corner of one of the isolation structures.

5. The Schottky diode device as claimed in claim 4, wherein the p-type doping region is formed with a dopant concentration of about $8*10^{15}$~$5*10^{16}$ atoms/cm$^3$.

6. The Schottky diode device as claimed in claim 4, further comprising an interlayer dielectric layer covers the isolation structures and between the anode electrode and the cathode electrode, wherein the interlayer dielectric layer covers the isolation structures and portions of the third n-type doping region and the p-type doping region adjacent to the isolation structures.

7. The Schottky diode device as claimed in claim 4, wherein the anode electrode physically contacts the p-type doping region and the first n-type doping region.

8. The Schottky diode device as claimed in claim 1, wherein the third n-type doping region is formed with a dopant concentration of about $1*10^{17}$~$5*10^{17}$ atoms/cm$^3$.

9. The Schottky diode device as claimed in claim 1, wherein the anode electrode and the cathode electrode comprise titanium, titanium nitride, tungsten or aluminum.

10. A method for fabricating a Schottky diode device, comprising:
    providing a p-type semiconductor layer;
    forming an n drift region in the p-type semiconductor layer, wherein the n drift region comprises a first n-type doping region and a second n-type doping region surrounding the first n-type doping region, and the second n-type doping region is formed with a dopant concentration greater than that in the first n-type doping region, and a bottom surface of the first n-type doping region physically contacts the p-type semiconductor layer;
    forming a plurality of isolation structures in the second n-type doping region adjacent to the first n-type doping region, thereby defining an anode region and a cathode region over the p-type semiconductor layer, wherein the anode region exposes the first n-type doping region and a portion of the second n-type doping region adjacent to the first n-type doping region, and the cathode region exposes another portion of second n-type doping region;
    forming a third n-type doping region in the second n-type doping region exposed by the cathode region; and
    forming an anode electrode and a cathode electrode in the anode region and the cathode region, respectively contacting the first n-type doping region and the third n-type doping region.

11. The method as claimed in claim 10, wherein the first n-type doping region is formed with a dopant concentration of about $4*10^{15}$~$2*10^{16}$ atoms/cm$^3$, and the second n-type doping region is formed with a dopant concentration of about $2*10^{16}$~$8*10^{16}$ atoms/cm$^3$.

12. The method as claimed in claim 10, wherein forming the n drift region in the p-type semiconductor layer comprises:
    forming a plurality of spaced first masking layers over the p-type semiconductor layer;
    performing a first ion implant process, and forming a plurality of fourth n-type doping regions and a plurality of p-type strip regions formed between the fourth n-type regions by using the first masking layers as implant masks;

removing the first masking layers; and performing a first annealing process, forming the first n-type doping region and the second n-type doping region surrounding the first n-type doping region to form the n drift region.

13. The method as claimed in claim 12, wherein the p-type strip regions are formed with a width of about 0.4~0.8 µm and a pitch of about 0.4-0.8 µm therebetween.

14. The method as claimed in claim 10, wherein prior to formation of the isolation structures, further comprising:

forming a first masking layer, partially exposing a portion of the second n-type doping region adjacent to the first n-type doping regions; and performing a first ion implant process, forming a p type doping region in the second n-type doping region adjacent to the first n-type doping region by using the first mask layer as an implant mask.

15. The method as claimed in claim 14, wherein during formation of the isolation structures further comprises:

simultaneously converting the p-type doping regions to a p-type guard ring at a junction between the first n-type doping region and the second n-type doping region, thereby covering a corner of the isolation structures.

16. The method as claimed in claim 15, wherein the p-type guard ring has a dopant concentration of about $8*10^{15}$~$5*10^{16}$ atoms/cm$^3$.

17. The method as claimed in claim 10, wherein the isolation structures are field oxides.

18. The method as claimed in claim 10, wherein the anode electrode and the cathode electrode comprise titanium, titanium nitride, tungsten, or aluminum.

* * * * *